US007307788B2

(12) United States Patent
Boettiger et al.

(10) Patent No.: US 7,307,788 B2
(45) Date of Patent: Dec. 11, 2007

(54) GAPLESS MICROLENS ARRAY AND METHOD OF FABRICATION

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/002,231

(22) Filed: Dec. 3, 2004

(65) Prior Publication Data

US 2006/0119950 A1 Jun. 8, 2006

(51) Int. Cl.
*G02B 27/10* (2006.01)
(52) U.S. Cl. .................... 359/619; 359/626
(58) Field of Classification Search ........ 359/618–619, 359/620, 626; 348/273–275, 207
See application file for complete search history.

(56) References Cited

U.S. PATENT DOCUMENTS

| 5,074,649 A | | 12/1991 | Hamanaka et al. |
| 5,238,856 A | * | 8/1993 | Tokumitsu .................. 348/294 |
| 5,466,926 A | | 11/1995 | Sasano et al. |
| 5,536,455 A | | 7/1996 | Aoyama et al. |
| 6,734,031 B2 | * | 5/2004 | Shizukuishi ................. 438/22 |
| 2001/0052629 A1 | | 12/2001 | Assadi et al. |
| 2002/0176037 A1 | * | 11/2002 | Li ............................... 349/95 |
| 2003/0063210 A1 | * | 4/2003 | Tsuboi ....................... 348/340 |
| 2003/0210462 A1 | | 11/2003 | Freese et al. |
| 2004/0080005 A1 | * | 4/2004 | Yamamoto .................. 359/619 |

FOREIGN PATENT DOCUMENTS

| JP | 2000 155201 | | 6/2000 |
| JP | 2000-260968 | * | 9/2000 |

* cited by examiner

*Primary Examiner*—Alicia M Harrington
(74) *Attorney, Agent, or Firm*—Dickstein Shapiro LLP (57) ABSTRACT

A microlens array having first and second sets of spherically-shaped microlenses. The second set of spherically-shaped microlenses are located in the areas between individual microlenses of the first set in such a way that there is minimized gapping over the entire microlens array. A semiconductor-based imager includes a pixel array having embedded pixel cells, each with a photosensor, and a microlens array having spherically-shaped microlenses as just described.

17 Claims, 6 Drawing Sheets

GAPLESS MICROLENS ARRAY AND METHOD OF FABRICATION

FIELD OF THE INVENTION

The invention relates generally to the field of semiconductor-based imager devices using microlenses, and more particularly to the fabrication of an array of microlenses for said devices.

BACKGROUND OF THE INVENTION

Solid state imagers, including charge coupled devices (CCD) and CMOS imagers, have been used in photo imaging applications. A solid state imager circuit includes a focal plane array of pixel cells, each one of the cells including a photosensor, which may be a photogate, photoconductor or a photodiode having a doped region for accumulating photo-generated charge. Microlenses are placed over imager pixel cells to focus light onto the initial charge accumulation region of the photosensor.

Use of microlenses significantly improves the photosensitivity of the imaging device by collecting light from a large light collecting area and focusing it onto a small photosensitive area of the photosensor. As the size of imager arrays and photosensitive regions of pixels continue to decrease, it becomes increasingly difficult to provide a microlens capable of focusing incident light rays onto the photosensitive regions of the pixel cell. This problem is due in part to the increased difficulty in constructing a microlens that has the optimal focal characteristics for the increasingly smaller imager device. Microlens shaping during fabrication is important for optimizing the focal point for a microlens. This in turn increases the quantum efficiency for the underlying pixel array. Utilizing a spherical microlens shape is better for focusing incoming light onto a narrow focal point, which allows for the desired decrease in photosensor size. Spherical microlenses, however, suffer from gapping problems which are undesirable as described below.

Microlenses may be formed through either a subtractive or an additive process. In the additive process, a lens material is formed on a substrate. The lens material is subsequently formed into a microlens.

In conventional additive microlens fabrication, an intermediate material is deposited in an array onto a substrate and formed into a microlens array using a reflow process. Each microlens is formed with a minimum distance, typically no less than 0.3 microns, between adjacent microlenses. Any closer than 0.3 micrometers may cause two neighboring microlenses to bridge during reflow. In the known process, each microlens is patterned in a material layer as a single square with gaps around it. During reflow of the patterned square microlens material, a gel drop is formed in a partially spherical shape driven by the force equilibrium of surface tension and gravity. The microlenses then harden in this shape. If the gap between two adjacent gel drops is too narrow, they may touch and merge, or bridge, into one larger drop. Bridging changes the shape of the lenses, which leads to a change in focal length, or more precisely the energy distribution in the focal range. A change in the energy distribution in the focal range leads to a loss in quantum efficiency of, and enhanced cross-talk between, pixels. On the other hand, if the gapping is too wide during fabrication, the gaps allow unfocused photons through the empty spaces in the microlens array, leading to lower quantum efficiency and increased cross-talk between respective photosensors of adjacent pixel cells.

Accordingly, it is desirable to form a microlens array having a smaller focal point in order to increase the quantum efficiency of the associated photosensors. It is also desirable to form a microlens array having minimized gapping between the microlenses without causing bridging during the microlens fabrication reflow process.

BRIEF SUMMARY OF THE INVENTION

Exemplary embodiments of the invention provide an improved microlens array for an imager.

In one exemplary microlens embodiment, the microlens array includes first and second sets of spherically-shaped microlenses formed from respective different layers of microlens material. The second set of spherically-shaped microlenses are located in the areas between individual microlenses of the first set in such a way that there is minimized gapping between the microlenses over the entire microlens array.

An exemplary semiconductor-based imager embodiment of the invention includes a pixel array and a microlens array. The pixel array has embedded pixel cells, each with a photosensor. The microlens array has spherically-shaped microlenses with first and second sets of microlenses, with the second set overlapping microlenses of the first set to minimize gapping between the lenses over the entire surface area of the array. The microlens array focuses light onto the photosensors of the pixel array using very narrow focal points.

An exemplary method of fabricating a microlens array includes forming a first set of spherically-shaped microlenses spaced apart over a substrate; and forming a second set of spherically-shaped microlenses within the spaces not occupied by the first set of microlenses. The method minimizes the overall gapping of the microlens array, while reducing the potential bridging effect or merging of adjacent lenses during fabrication.

BRIEF DESCRIPTION OF THE DRAWINGS

The foregoing and other advantages and features of the invention will be more readily understood from the following detailed description of the invention provided below with reference to the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "wafer" or "substrate" as used herein, is to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor device and associated structures for converting photons to an electrical signal. For purposes of illustration, a single representative three-color pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

The term "sphere," "spherical," or "spherically-shaped" as used herein is intended to refer to objects having nearly spherical shape or resembling a sphere in geometry. The term is not meant to exclude objects that are not perfectly spherical in shape but should be interpreted as encompassing microlenses having nearly spherical curvature. Similarly, the term "substantially gapless" is intended to cover not only microlens arrays having zero gaps between individual microlenses, but is also intended to more broadly encompass microlens arrays having substantially no gapping among the microlenses. For example, a microlens array having approximately 3% or less of its surface area being space not covered by a microlens (i.e., 3% or less gaps), is considered substantially gapless and is within the scope of the invention. In a preferred embodiment of a substantially gapless microlens array according to the invention, less than 2% of the total surface area is gaps.

Finally, while the invention is described with reference to a semiconductor-based imager, such as a CMOS imager, it should be appreciated that the invention may be applied in any micro-electronic or micro-optical device that requires high quality microlenses for optimized performance. Other exemplary micro-optical devices that can employ the invention include CCD imagers and display devices.

Figure 1A:
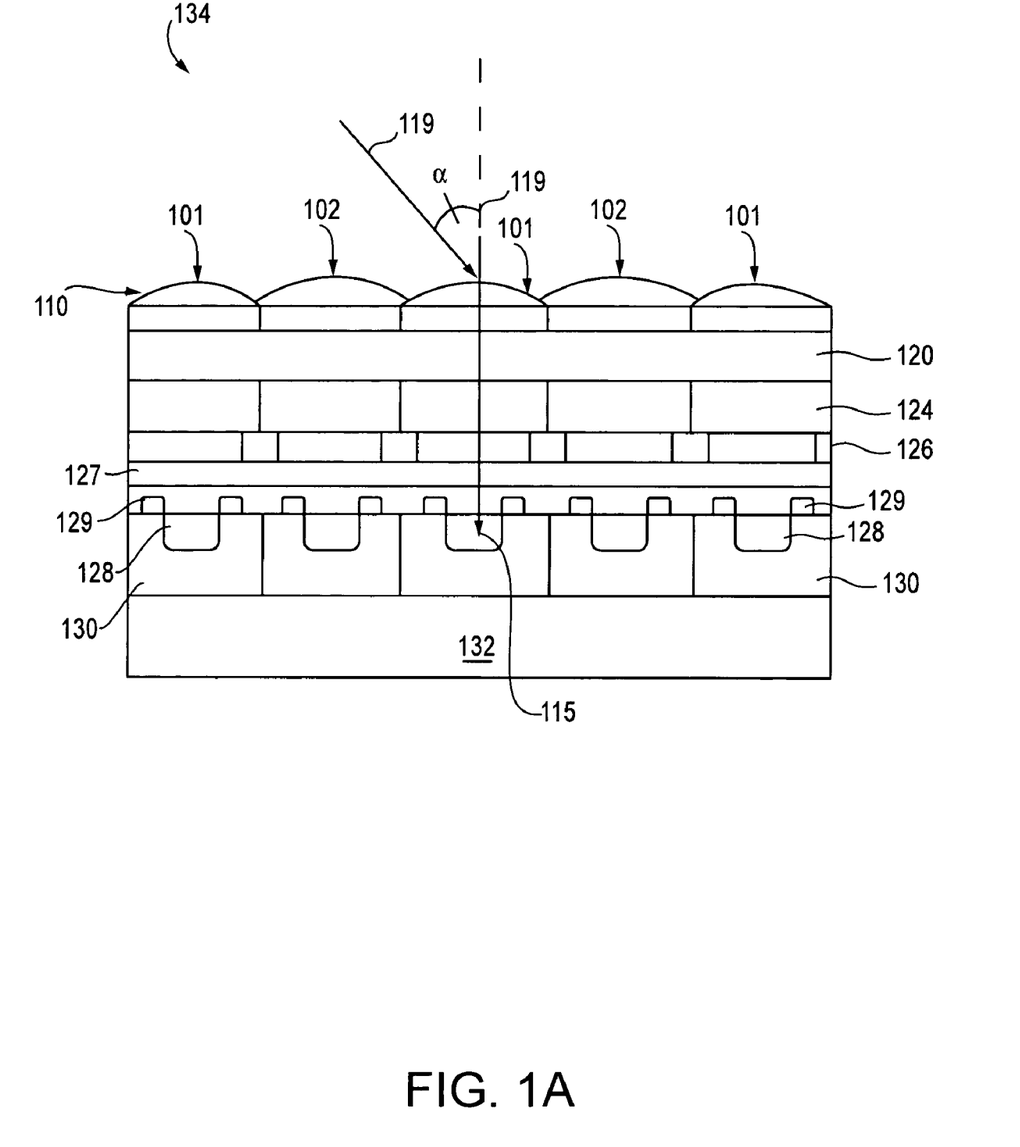
FIG. 1A is a cross sectional view of a part of an imager device including a microlens array according to an exemplary embodiment of the invention.
Figure 1B:
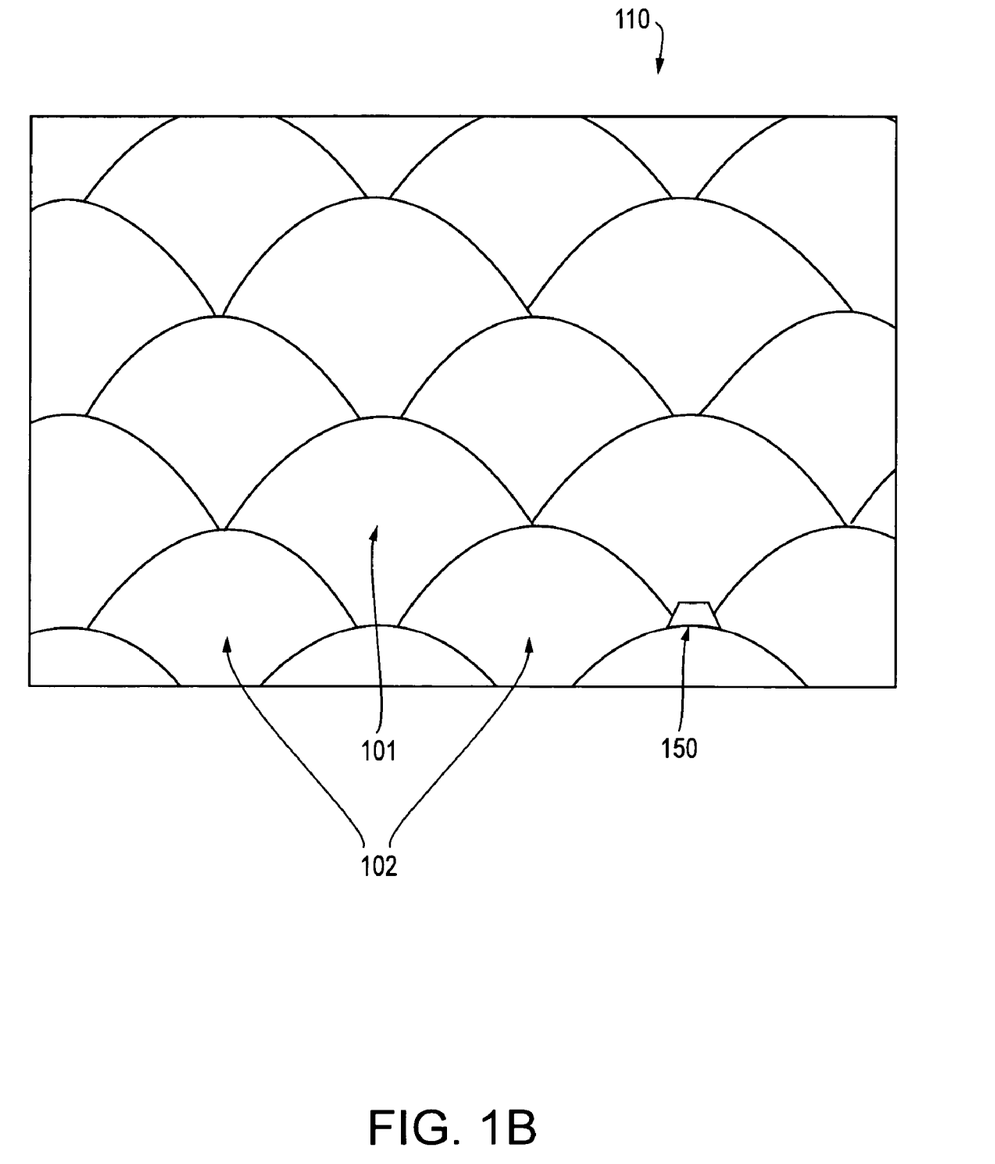
FIG. 1B is an angled top-down image of a microlens array according to an exemplary embodiment of the invention.

Now, with reference to the Figures, where like numbers represent like elements, FIG. 1A illustrates a part of a semiconductor-based imager 134, such as a CMOS imager. The imager 134 includes a microlens array 110, with a first set of microlenses 101 and a second set of microlenses 102 formed on a receiving surface 120. Beneath the microlens array 110 is a color filter array 124, a light shield layer 126, at least one ILD layer 127, which also may encompass metal wiring interconnects (not shown), and pixel cells 130 embedded within a wafer 132. Additional layers, such as additional BPSG and ILD layers may also be a part of the imager 134 as known in the art. Each pixel cell 130 includes transistors 129 and a photosensor 128, which may be any type of photosensor, including but not limited to a photogate or photodiode. Each microlens 101, 102 is associated with focusing light 119 onto one associated photosensor 128. Although the first set of microlenses 101 and the second set of microlenses 102 are shown in FIGS. 1A and 1B to have the same curvature and size, the invention is not so limited. That is, these characteristics may also be different between the first 101 and second sets 102 such that they may have different curvatures and/or different diameters.

It should be understood that the overlap of the second set of microlenses 102 with the adjacent first set of microlenses 101 reduces the gapping problem discussed above. As shown in FIG. 1B, each microlens abuts four other adjacent microlenses such that the gaps 150 are in minimized areas over the microlens array 110. In addition, the microlenses 101, 102 have a spherical shape which focuses incoming light 119 onto a narrow focal point 115 on the photosensors 128, even when the incoming light 119 strikes a microlens 101 at an angle α.

Figure 2A:
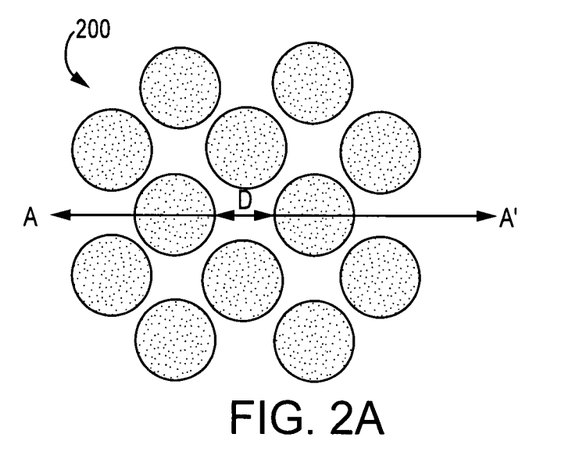
FIG. 2A is a top-down view illustrating a microlens array during an initial stage of fabrication in accordance with an exemplary method of fabrication.

With reference to FIGS. 2A-5B, an exemplary method of making the substantially gapless microlens array 110 is now described. Turning to FIGS. 2A-B, a first step in the fabrication of microlens array 110 involves depositing a first microlens material 201 onto a receiving surface 120 (FIG. 1A). Any known microlens material may be used for this step, and the invention is in no way limited to the type of microlens material selected. An exemplary microlens material is a photoresist such as MFR-401, manufactured by Japan Synthetic Rubber Company. The microlens material 201 is deposited using a first circular lens pattern 200. The first lens pattern 200 is a checkerboard pattern of repeating material circles, arranged in rows and columns which leaves spaces D between the microlens material. The individual material circles could also be formed in other shapes such as squares, as long as when reflow occurs, as discussed below, a spherical lens shape is obtained. In the patterning step, a thin film of microlens material 201 of a pre-determined thickness is coated on the receiving surface 120; the material 201 is exposed using a suitable mask; and it is developed to either dissolve the exposed microlens material 201 (positive resist) or dissolve the unexposed microlens material 201 (negative resist). The first lens pattern 200, or photomask, is generally a light mask with aperture stops and apertures that serve to convert a uniform light field to a spatially-patterned light field. Typically, a lens pattern 200 is a substantially flat glass receiving surface on which a pattern of chromium has been evaporated. The pattern of chromium defines the UV light field to be transmitted to the microlens material 201. Other types of masks may be used, such as variable transmission masks, as will be recognized by one of ordinary skill in the art.

Figure 2B:
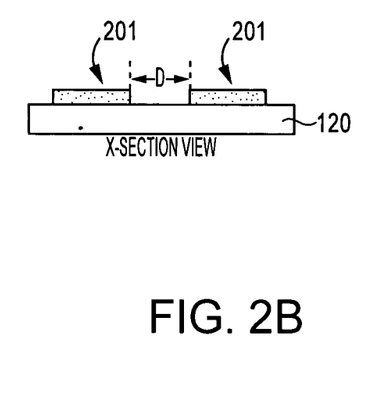
FIG. 2B is a cross-sectional view illustrating a microlens array during an initial stage of fabrication in accordance with the exemplary method of fabrication.

As shown in cross-sectional view in FIG. 2B, the deposited material at this stage has significant gapping, as the microlens material 201 is a distance D apart from adjacent material 201 in the direction of a bisecting line A-A' through a row of material circles. A bleaching step may be required at this point, depending on the resist material used and the desired focal characteristics. Bleaching is typically performed by exposing the microlens material 201 to ultraviolet (UV) radiation, which modifies the reflow response of the microlens material 201. Bleaching of the microlens material 201 typically reduces the melting of the material 201 that takes place during the subsequent reflow processing. Accordingly, bleaching can create less round microlenses having longer focal lengths, if desired. The bleaching step can be controlled by adjusting the UV radiation level, the exposure time, and the portions of the pre-reflow microlens material 201 that are exposed to the bleaching radiation. By controlling these conditions, bleaching may be used without significantly affecting the spherical shape of the microlenses that are formed.

Figure 3A:
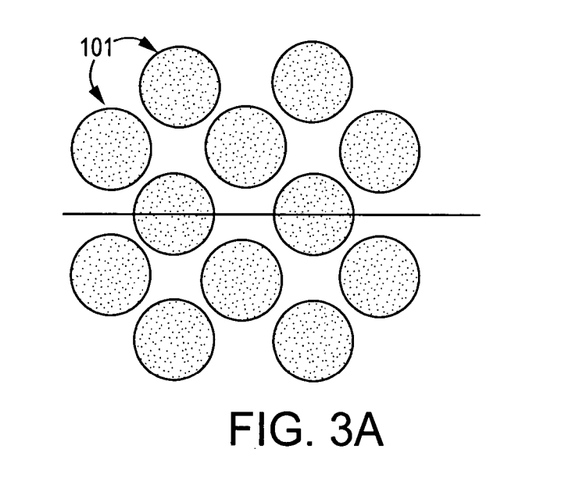
FIG. 3A is a top-down view illustrating a microlens array during a stage of fabrication subsequent to that shown in FIG. 2A.
Figure 3B:
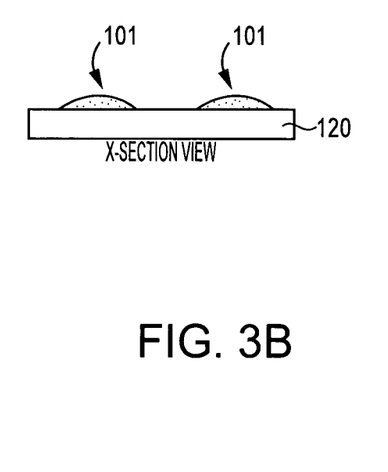
FIG. 3B is a cross-sectional view illustrating a microlens array during a stage of fabrication subsequent to that shown in 2B.

Next, as shown in FIG. 3B, the first micro lens material 201 is subjected to a first reflow process and is cured to form the first set of microlenses 101. Typically, the first reflow step is done on a hot plate with a uniform temperature in the range of about 150° C. to about 220° C., depending on the type of microlens material 201 selected. Equilibrium forces during the reflow process cause the microlens material 201 to form into the spherical shape of the first set of microlenses. From the top-down view (FIG. 3A), there is no difference in the layout after the curing steps. The microlenses 101 remain in a circular checkerboard pattern over the receiving surface 120. At this point, the microlenses 101 are solid, and will not be affected by the subsequent fabrication steps.

Figure 4A:
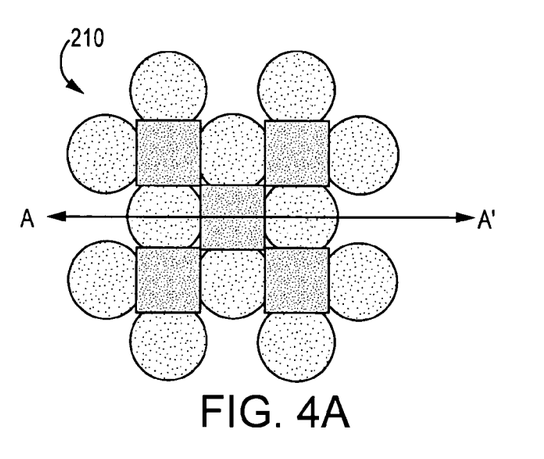
FIG. 4A is a top-down view illustrating a microlens array during a stage of fabrication subsequent to that shown in FIG. 3A.
Figure 4B:
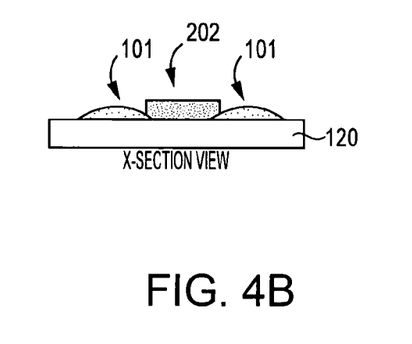
FIG. 4B is a cross-sectional view illustrating a microlens array during a stage of fabrication subsequent to that shown in FIG. 3B.
Figure 5A:
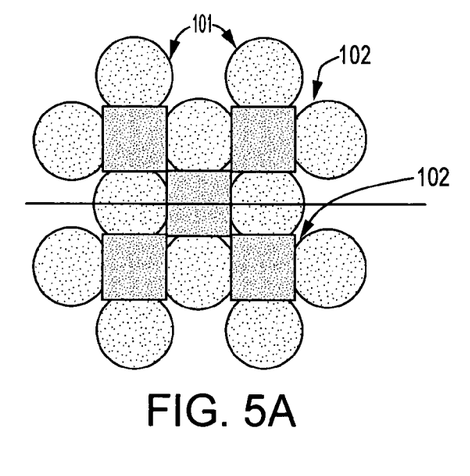
FIG. 5A is a top-down view illustrating a microlens array during a stage of fabrication subsequent to that shown in FIG. 4A.

Next, as shown in FIGS. 4A-B, a second microlens material 202 is deposited and patterned on the receiving surface 120 in the spaces between and over the first microlenses 101. The depositing and patterning step is similar to that discussed with reference to FIGS. 2A-B except that a second reticle is used having a checkerboard lens pattern 210 to produce square material elements, rather than circular material elements used in forming the first set of microlenses 101. The second microlens material 202 may or may not be the same material as the first microlens material 201 and may have the same or a different thickness than the first microlens material 201. As shown in FIG. 5A, each second microlens material 202 deposited contacts and overlaps the edges of four first microlenses 101.

Figure 5B:
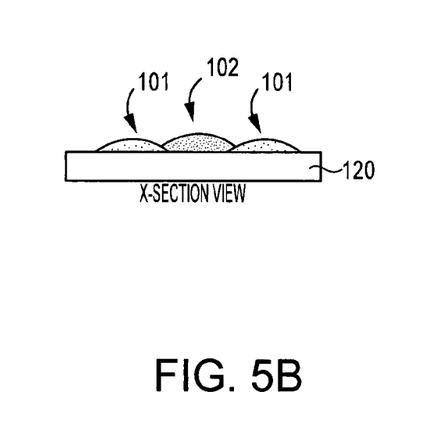
FIG. 5B is a cross-sectional view illustrating a microlens array during a stage of fabrication subsequent to that shown in FIG. 4B.

A bleaching step may be performed at this point depending on the second microlens material 202 utilized and the desired characteristics of the second set of microlenses 102. As shown in FIG. 5B, the second lens material 202 is then reflowed and cured to form a second set of spherical-shaped lenses 102 in the area between adjacent lenses of the first set of microlenses 101. The reflow conditions may be identical to the first reflow conditions, or they may be different depending on the type of second microlens material 202 selected, and the desired shape of the second set of microlenses 102.

One important factor in fabrication is that the square deposit of the second microlens material 202 is not deposited onto a flat surface, but rather, is set partially over the edges of existing first set of microlenses 101. This allows the square-shaped deposit of second material 202 to form a spherical second set of microlenses 102 after curing (FIG. 5B), without producing gaps between adjacent microlenses. In fact, the second lens material 202 is deposited abutting four adjacent first microlenses 101 which have predominately hardened. This abutment allows the formation of a substantially gapless microlens array 110, i.e., total gap area is less than or approximately equal to 3% of the entire microlens array 110 area, as the gap area between adjacent microlenses is minimized. In addition, forming the lens sets 101, 102 in two stages reduces the bridging problems discussed above. Specifically, the flow of the second microlens material 202 during reflow does not affect the solid first set of microlenses 101 that have already formed so that no bridging of adjacent lenses occurs during formation.

For some imager 134 applications, it is desirable that the two sets of microlenses 101, 102 have different focal lengths or sizes. For example, the two sets of microlenses 101, 102 may be used to focus incoming light 119 (FIG. 1) to different depths in the pixel substrate 130. In these instances, either the type or thickness of the deposited second microlens material 202 or the reflow conditions may be adjusted to achieve the desired differences between the first set 101 and second set 102 of microlenses.

Figure 6:
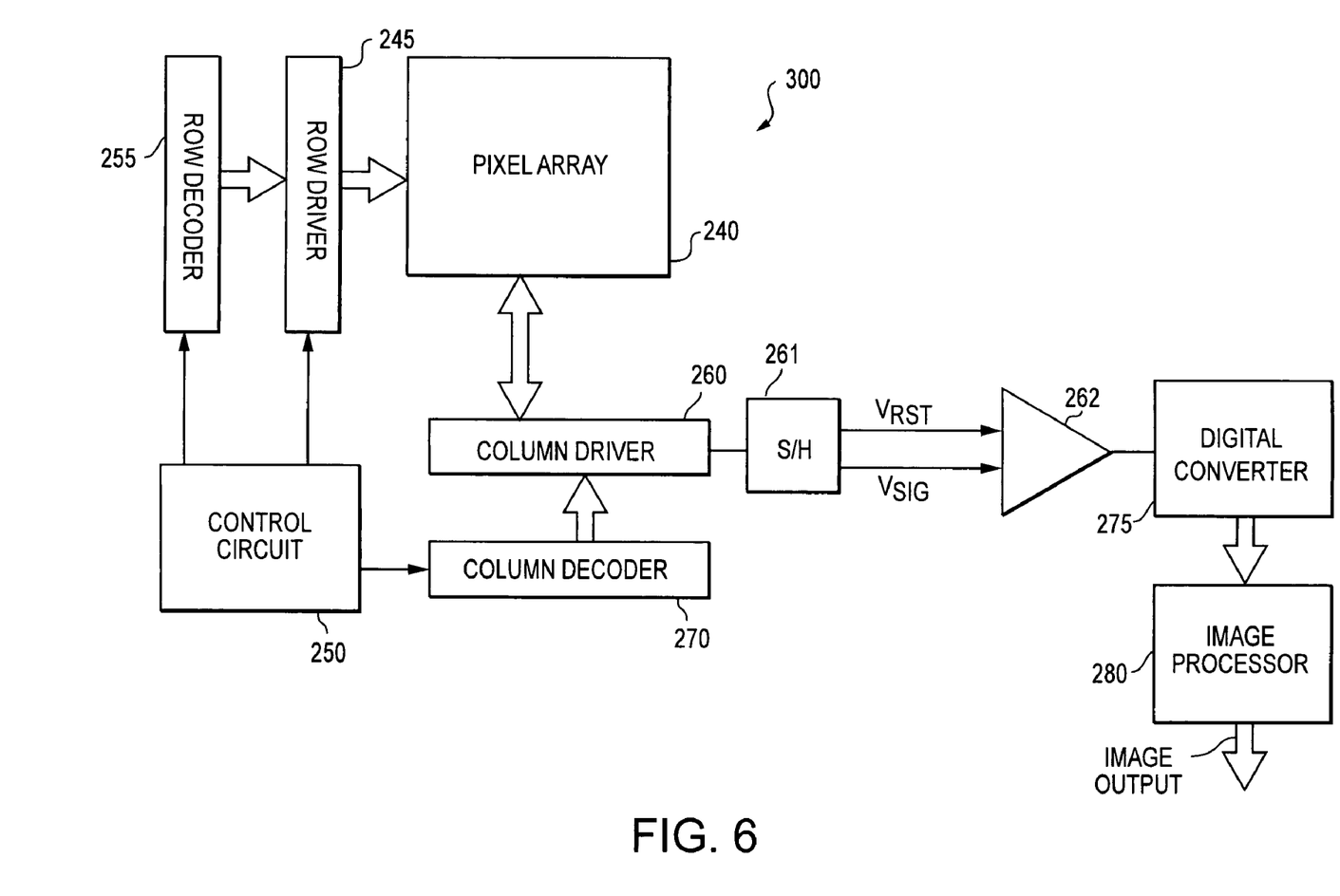
FIG. 6 shows a block diagram of an imager having a microlens array constructed in accordance with an exemplary embodiment of the invention.

FIG. 6 illustrates an exemplary imaging device 300 having a pixel array 240 comprising pixels and a microlens array 110 constructed as described above with reference to FIGS. 2A-5B. Row lines of the array 240 are selectively activated by a row driver 245 in response to row address decoder 255. A column driver 260 and column address decoder 270 are also included in the imaging device 300. The imaging device 300 is operated by the timing and control circuit 250, which controls the address decoders 270, 255. The control circuit 250 also controls the row and column driver circuitry 245, 260.

A sample and hold circuit 261 associated with the column driver 260 reads a pixel reset signal Vrst and a pixel image signal Vsig for selected pixels of the array 240. A differential signal (Vrst-Vsig) is produced by differential amplifier 262 for each pixel and is digitized by analog-to-digital converter 275 (ADC). The analog-to-digital converter 275 supplies the digitized pixel signals to an image processor 280 which forms a digital image.

Figure 7:
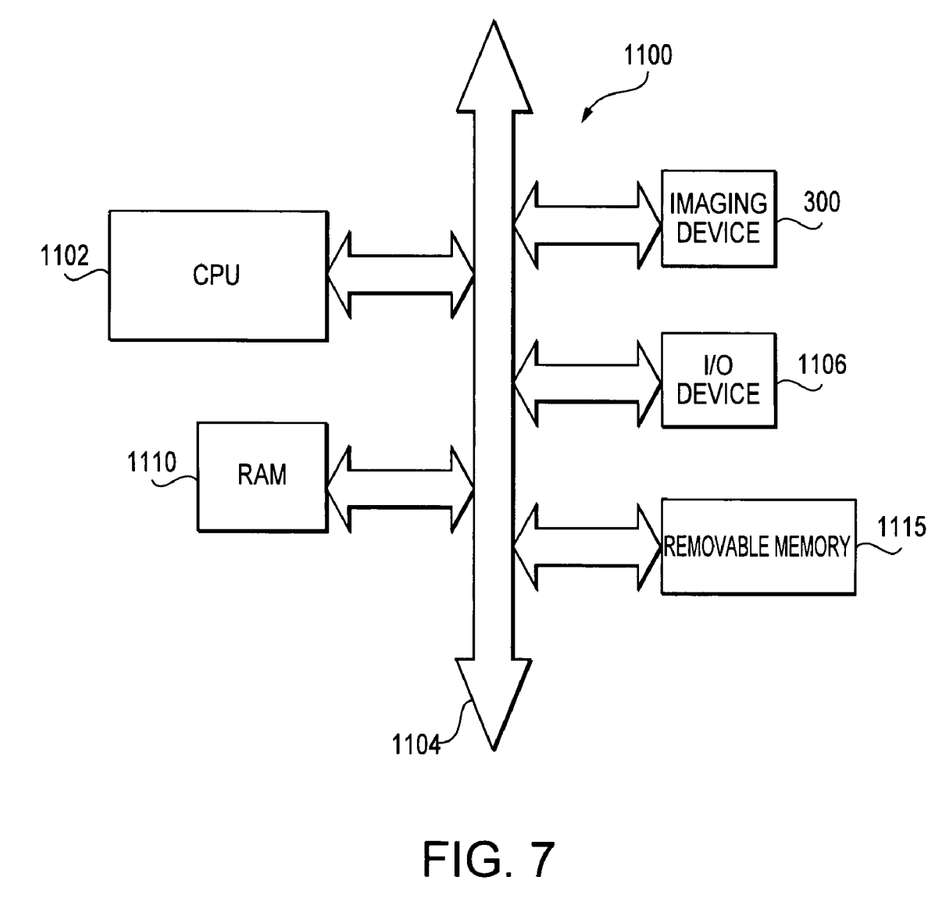
FIG. 7 shows a processor system incorporating at least one imaging device including a microlens array constructed in accordance with an embodiment of the invention.

FIG. 7 shows system 1100, a typical processor system modified to include the imaging device 300 (FIG. 6) of the invention. The system 1100 is exemplary of a system having digital circuits that could include image sensor devices. Without being limiting, such a system could include a computer system, still or video camera system, scanner, machine vision, video phone, and auto focus system, or other imager applications.

System 1100, for example a camera system, generally comprises a central processing unit (CPU) 1102, such as a microprocessor, that communicates with an input/output (I/O) device 1106 over a bus 1104. Imaging device 300 also communicates with the CPU 1102 over the bus 1104. The processor-based system 1100 also includes random access memory (RAM) 1110, and can include removable memory 1115, such as flash memory, which also communicate with the CPU 1102 over the bus 1104. The imaging device 300 may be combined with a processor, such as a CPU, digital signal processor, or microprocessor, with or without memory storage on a single integrated circuit or on a different chip than the processor.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, the invention can be used in display devices where light is being radiated by microlenses. Accordingly, the invention is not to be seen as limited by the foregoing description, but is only limited by the scope of the appended claims.

What is claimed as new and desired to be protected by Letters Patent of the United States is:

1. An imager comprising:
   a pixel array comprising a plurality of pixels, each having a photosensor embedded in a substrate;
   a color filter array comprising a plurality of color filters, each filter located at least partially over at least one pixel; and
   a single substantially gapless microlens array formed over the pixel array, wherein no other microlenses are located between the microlens array and the pixel array, said microlens array comprising:
      a plurality of first spherically-shaped microlenses formed of a microlens material in a first material layer; and
      a plurality of second spherically-shaped microlenses formed of the same microlens material in a second material layer and arranged such that each of said second spherically-shaped microlenses abuts at least four of said first spherically-shaped microlenses, wherein said first and second plurality of microlenses share a common light wavelength transmissivity characteristic,
      wherein the plurality of first microlenses have a different focal length than a focal length of the plurality of second microlenses in order to focus incoming light at a different depth in the substrate.

2. The imager of claim 1, wherein the imager is a CMOS imager.

3. The imager of claim 1, wherein the imager is a CCD imager.

4. The imager of claim 1, wherein the photosensors comprise photodiodes.

5. The imager of claim 1, wherein the photosensors comprise photogates.

6. The imager of claim 1, wherein the color filter array is in a Bayer pattern.

7. The imager of claim 1, wherein less than 2% of the total surface area of the microlens array is gap spaces, not covered by either a first or a second spherically-shaped microlens.

8. An image processing system comprising;
   a processor; and
   an imager connected to the processor and comprising:
      a substrate having a plurality of pixel cells formed thereon, each pixel cell having a photosensor;
      a color filter array comprising a plurality of color filters located over said plurality of pixel cells; and
      a single gapless microlens array, formed of a microlens material located over the pixel cells and comprising a plurality of spherically-shaped microlenses having approximately no space between adjacent microlenses, each microlens having a common light wavelength transmissivity characteristic, there being no other microlenses between the microlens array and the pixel cells, the microlenses being organized into first and second microlenses, wherein the first microlenses have a different focal length than a focal length of the second microlenses in order to focus incoming light at a different depth in the substrate.

9. The image processing system of claim 8, wherein the imager is a CMOS imager.

10. The image processing system of claim 8, wherein the imager is a CCD imager.

11. The image processing system of claim 8, wherein having approximately no space between adjacent microlenses means that there is less than approximately 2% of the total surface area of the microlens array that is not covered by spherically shaped microlenses.

12. A method of forming an imager comprising:
   forming a pixel array comprising a plurality of pixels in a substrate, each pixel having a photosensor; and
   forming a single substantially gapless microlens array comprising a plurality of spherically-shaped microlenses over the pixel array such that each spherically-shaped microlens has a common light wavelength transmissivity characteristic and is located over a pixel of the array for focusing incoming light on an associated photosensor in the pixel array with no other microlenses being between the microlens array and the pixel array, each microlens abutting at least four other microlenses on the array, the microlenses being organized into first and second microlenses, wherein the first microlenses have a different focal length than a focal length of the second microlenses in order to focus incoming light at a different depth in the substrate.

13. The method of claim 12, wherein the gapless microlens array has less than approximately 2% of its surface area not covered by microlenses.

14. The method of claim 12, wherein the act of forming a substantially gapless microlens array comprises forming the first microlenses as a plurality of first spherically-shaped microlenses in a first material layer and the second microlenses as a plurality of second spherically-shaped microlenses in a second material layer.

15. The method of claim 14, wherein the act of forming a plurality of first spherically-shaped microlenses comprises use of a repeated pattern of circle-shaped material to pattern the microlens material into the first plurality of lenses.

16. The method of claim 15, wherein the act of forming a plurality of second spherically shaped microlenses comprises use of a repeated pattern of square-shaped material to pattern the microlens material into the second plurality of lenses.

17. The method of claim 12, further comprising forming a color filter array comprising a plurality of color filters located over said pixel array such that every color filter is located at least partially over at least one of said pixels.

* * * * *